(12) United States Patent
Takata et al.

(10) Patent No.: US 9,865,816 B2
(45) Date of Patent: Jan. 9, 2018

(54) SOLUTION FOR FORMING FUNCTION LAYER CONTAINED IN ORGANIC LIGHT EMITTING ELEMENT AND METHOD FOR MANUFACTURING ORGANIC LIGHT EMITTING ELEMENT

(71) Applicant: JOLED INC., Tokyo (JP)

(72) Inventors: Masakazu Takata, Tokyo (JP); Hirotaka Nanno, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/125,403

(22) PCT Filed: Feb. 26, 2015

(86) PCT No.: PCT/JP2015/001002
§ 371 (c)(1),
(2) Date: Sep. 12, 2016

(87) PCT Pub. No.: WO2015/141151
PCT Pub. Date: Sep. 24, 2015

(65) Prior Publication Data
US 2017/0117471 A1   Apr. 27, 2017

(30) Foreign Application Priority Data
Mar. 17, 2014  (JP) .................. 2014-053357

(51) Int. Cl.
*H01L 21/00* (2006.01)
*H01L 51/00* (2006.01)
(Continued)

(52) U.S. Cl.
CPC ...... *H01L 51/0007* (2013.01); *H01L 51/5012* (2013.01); *H01L 51/5056* (2013.01);
(Continued)

(58) Field of Classification Search
CPC ......... C09D 11/36; C09D 11/52; C09K 11/06; H01L 51/5088; H01L 51/5092;
(Continued)

(56) References Cited

U.S. PATENT DOCUMENTS 5,443,922 A      8/1995  Nishizaki et al.
2011/0220853 A1* 9/2011  Yoshimoto .......... C09K 11/06
                                             252/519.3

(Continued)

FOREIGN PATENT DOCUMENTS

JP   05-163488 A    6/1993
JP   2011-023668 A  2/2011
(Continued)

*Primary Examiner* — Zandra Smith
*Assistant Examiner* — Evan Clinton
(74) *Attorney, Agent, or Firm* — Chip Law Group

(57) ABSTRACT

A solution contains a functional material for constituting a function layer, and a solvent. The solvent contains a high-boiling-point solvent composed of one or more solvent components having a boiling point of not less than 200° C. The high-boiling-point solvent has a viscosity of from 13 mPa·s to 25 mPa·s, inclusive, and a surface tension of from 33 mN/m to 37 mN/m, inclusive.

16 Claims, 15 Drawing Sheets

(a)

(b)

(c)

(51) Int. Cl.
*H01L 51/50* (2006.01)
*H01L 51/56* (2006.01)

(52) U.S. Cl.
CPC .......... *H01L 51/5072* (2013.01); *H01L 51/56* (2013.01); *H01L 2251/55* (2013.01)

(58) Field of Classification Search
CPC ............. H01L 51/5048; H01L 51/5056; H01L 51/5072; H01L 51/0007
See application file for complete search history.

(56) References Cited

U.S. PATENT DOCUMENTS

2013/0256636 A1   10/2013  Watanabe
2017/0145235 A1*  5/2017  Tregub ................... C09D 11/36

FOREIGN PATENT DOCUMENTS

| JP | 2011-515835 A | 5/2011 |
|---|---|---|
| JP | 2013-143324 A | 7/2013 |
| JP | 2013-214397 A | 10/2013 |
| WO | 2008/035501 A | 3/2008 |
| WO | 2009/109273 A | 9/2009 |
| WO | 2013/046265 A | 4/2013 |

* cited by examiner

[FIG. 1]
(a)
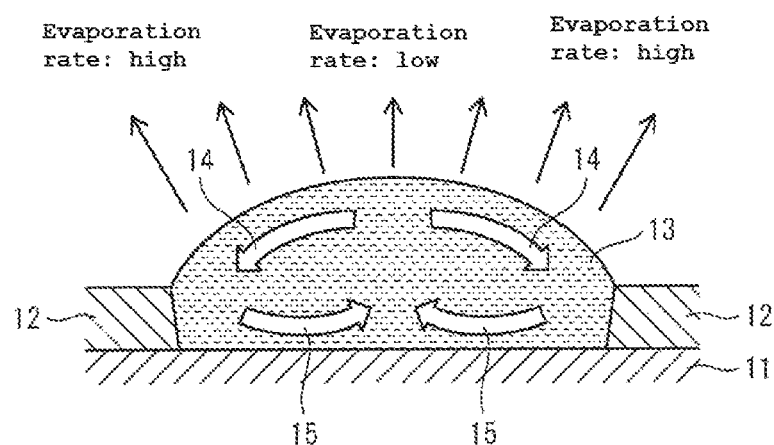
(b)
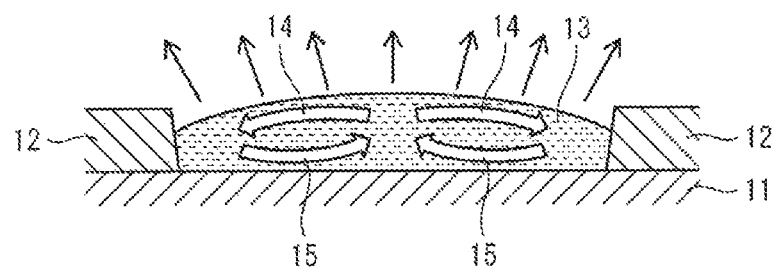
(c)

[FIG. 2]

| Solvent | Boiling point | Viscosity | Surface tension |
|---|---|---|---|
| Isopropyl alcohol | 82°C | 2.4 | 20.8 |
| Butanol | 118°C | 3.0 | 26.0 |
| Xylene | 144°C | 0.7 | 28.2 |
| N,N-Dimethylformamide | 153°C | 0.9 | 36.8 |
| Cyclohexanol | 160°C | 54.5 | 34.0 |
| 2,3-Butanediol | 182°C | 83.2 | 33.4 |
| Propylene glycol | 187°C | 10.7 | 36.5 |
| Dimethyl sulfoxide | 189°C | 2.0 | 43.5 |
| Ethylene glycol | 197°C | 16.1 | 45.2 |
| Ethylene glycol monoethyl ether acetate | 217°C | 2.5 | 30.9 |
| 1,3-dimethyl-2-imidazoline | 225°C | 2.1 | 40.1 |
| Diethylene glycol monobutyl ether | 230°C | 6.5 | 33.6 |
| Dipropylene glycol | 231°C | 38.0 | 32.0 |
| Cyclohexylbenzene | 238°C | 2.9 | 34.4 |
| Ethylene glycol monophenyl ether | 245°C | 28.6 | 42.0 |
| Ethylene glycol monobutyl ether | 265°C | 12.4 | 40.7 |

///  High-boiling-point solvent (Boiling point ≥ 200°C)

\\\  High-viscosity solvent (Viscosity ≥ 20 mPa·s)

[FIG. 3]
(a)
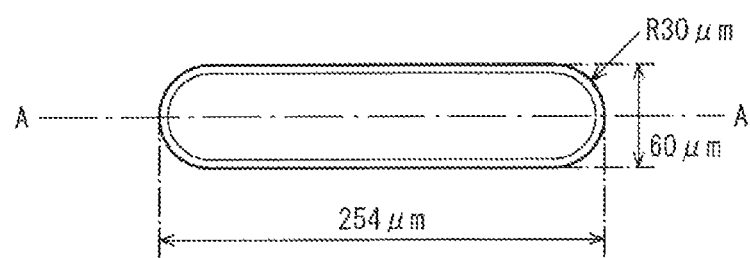
(b)
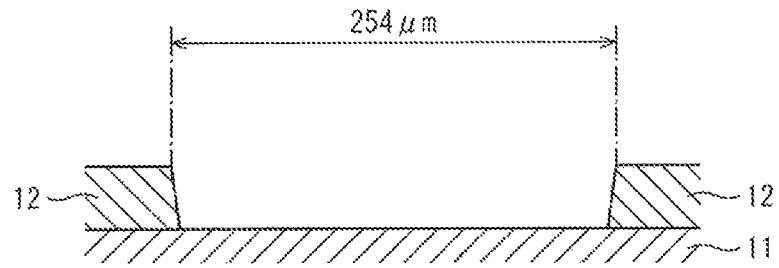

[FIG. 4]
(a)
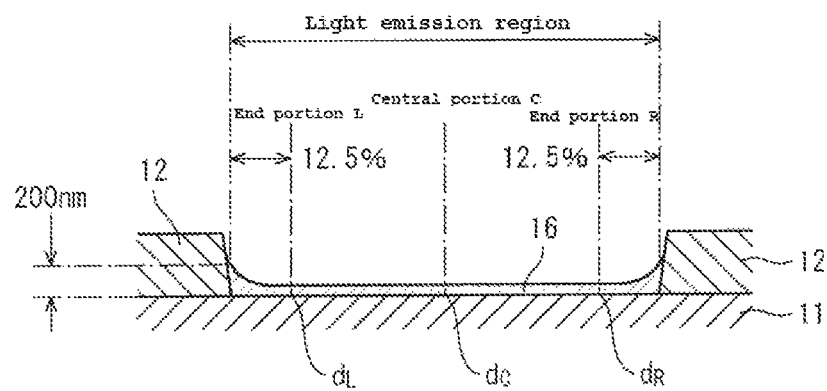
(b)
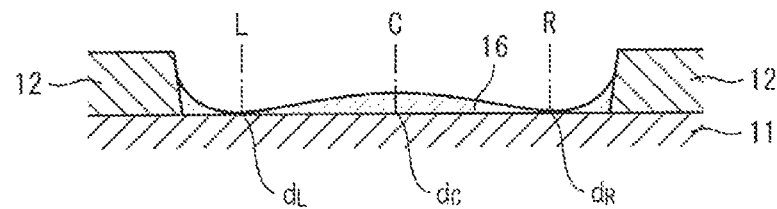
(c)
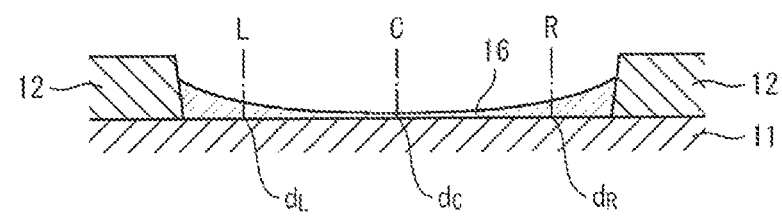

[FIG. 5]

| Solvent | Photograph | Function layer shape |
|---------|------------|----------------------|
| A, B | | Convex |
| C, E | | Concave |
| H | | Convex |
| D | | Flat |
| F | | Flat |
| G | | Flat |

[FIG. 6]

| Solvent | Function layer shape | Viscosity of high-boiling-point solvent (mPa·s) | Surface tension of high-boiling-point solvent (mN/m) |
|---|---|---|---|
| A | Convex | 2.1 | 40.1 |
| B | Convex | 2.1 | 40.1 |
| C | Concave | 2.28 | 36.0 |
| D | Flat | 16.6 | 34.4 |
| E | Concave | 2.25 | 36.6 |
| F | Flat | 15.2 | 35.0 |
| G | Flat | 16.1 | 35.6 |
| H | Convex | 11.1 | 41.1 |

[FIG. 7]
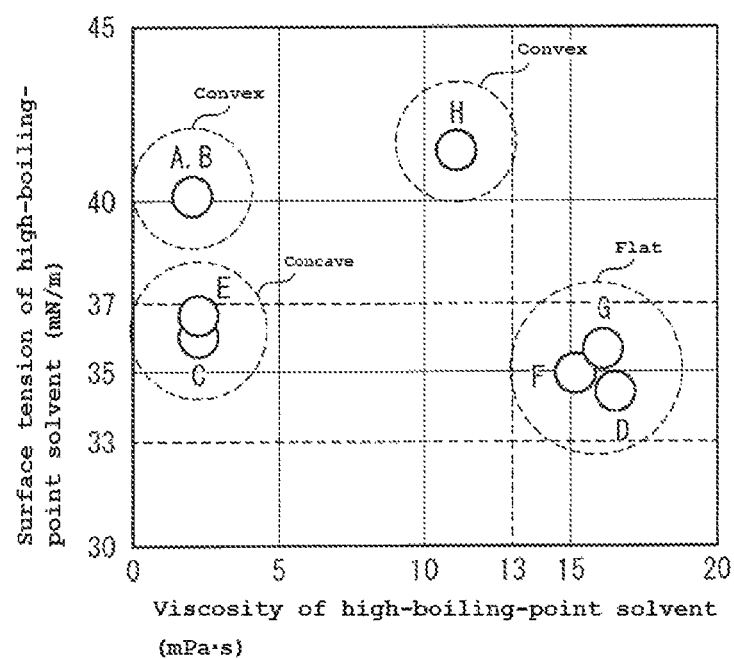

[FIG. 8]
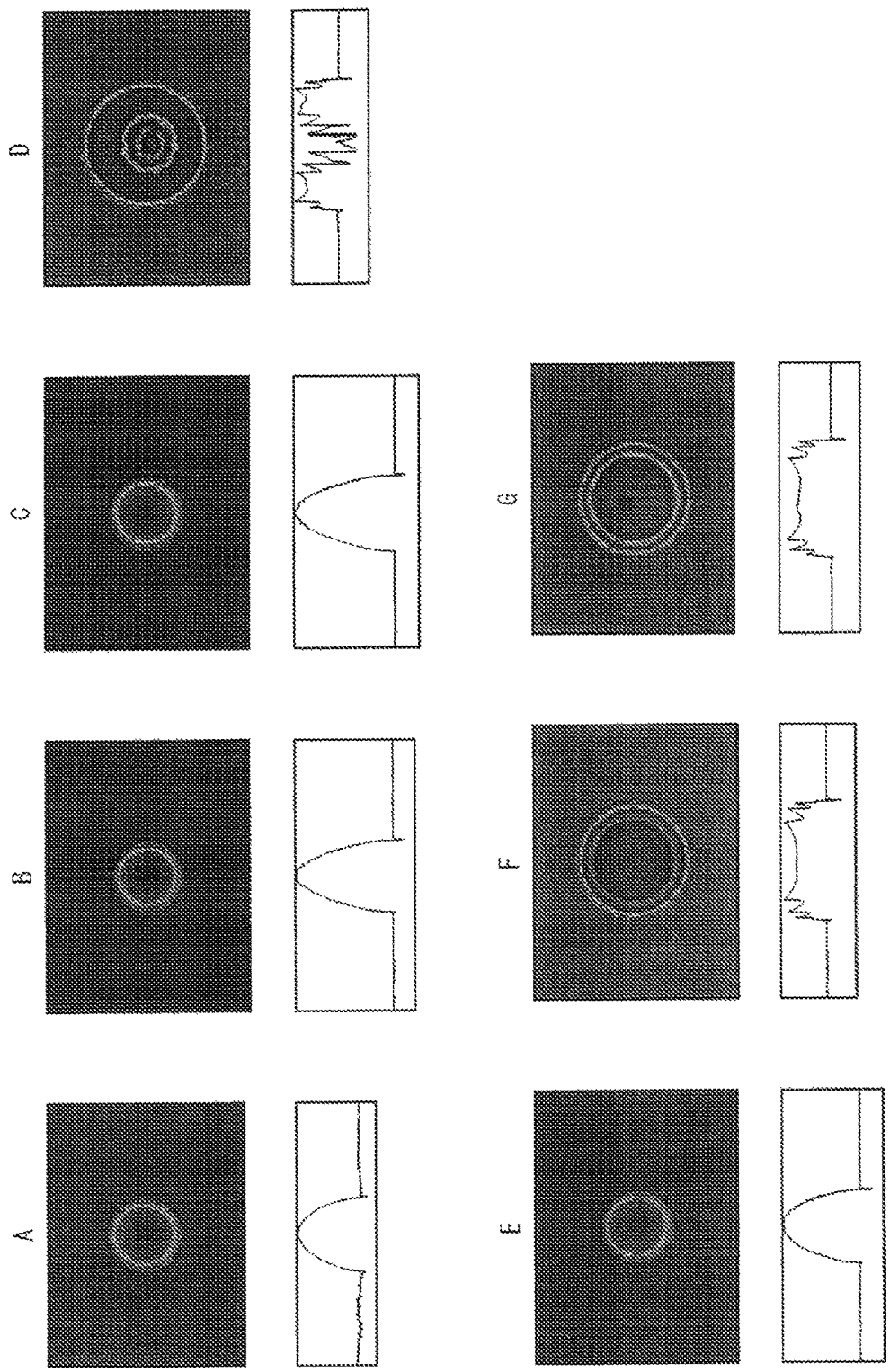

[FIG. 9]
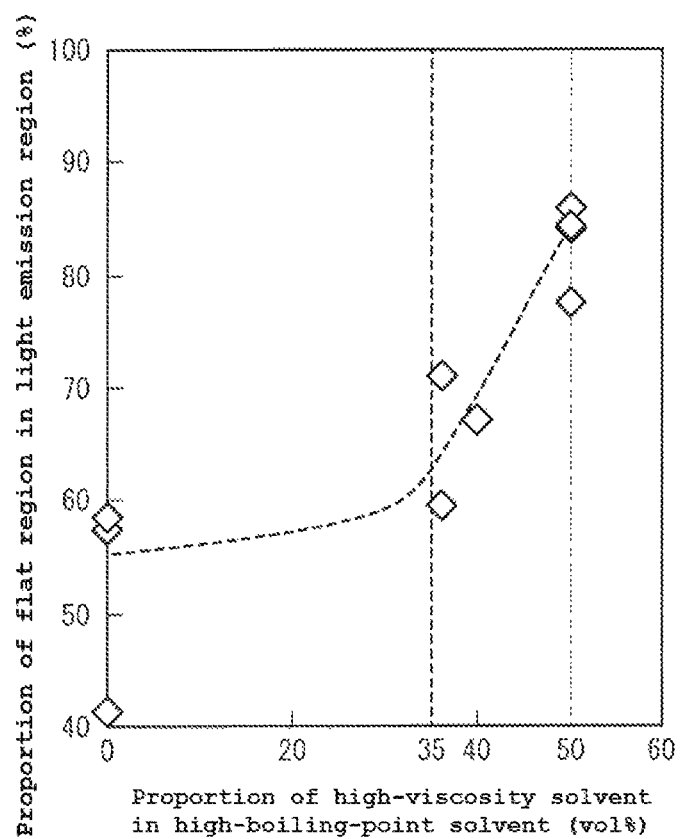

[FIG. 10]
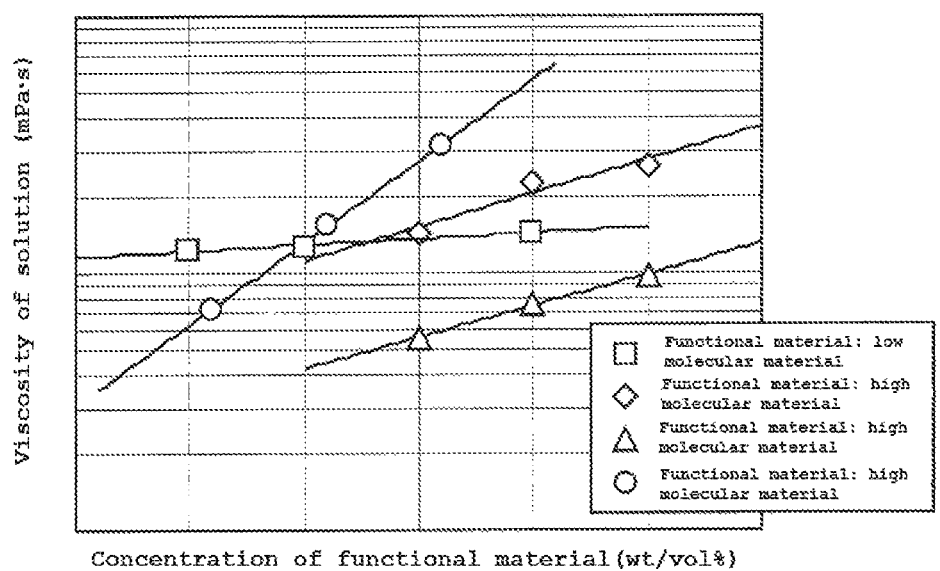

[FIG. 11]
(a) 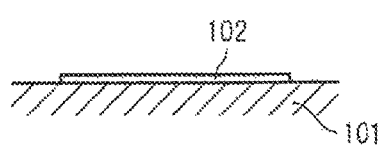
(e) 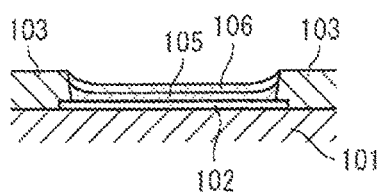
(b) 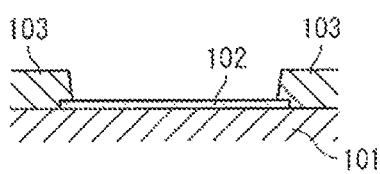
(f) 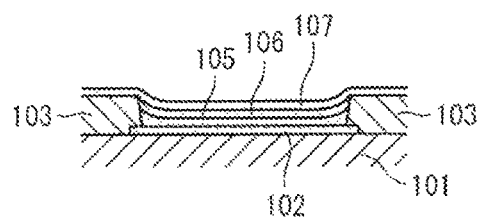
(c) 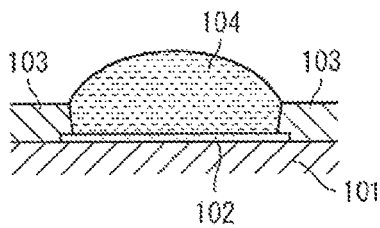
(g) 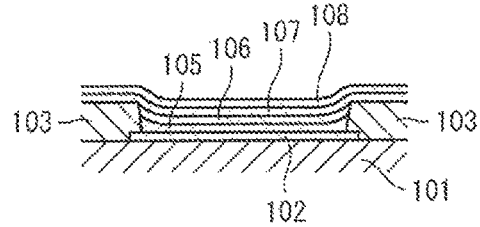
(d) 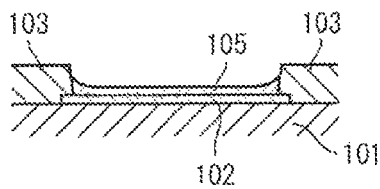

[FIG. 12]
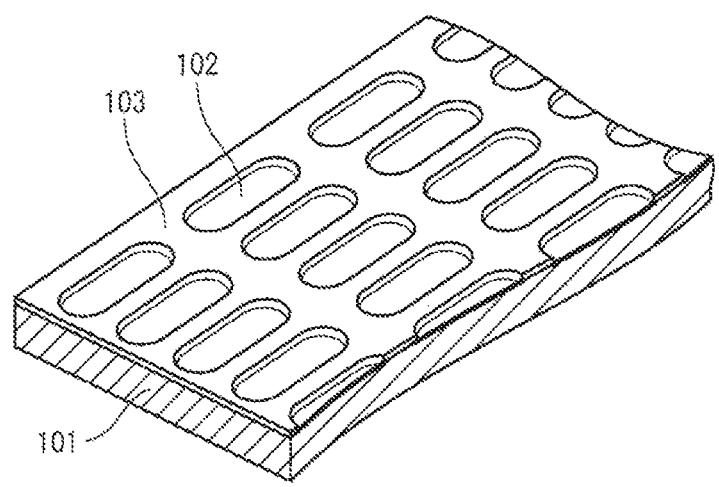
[FIG. 13]
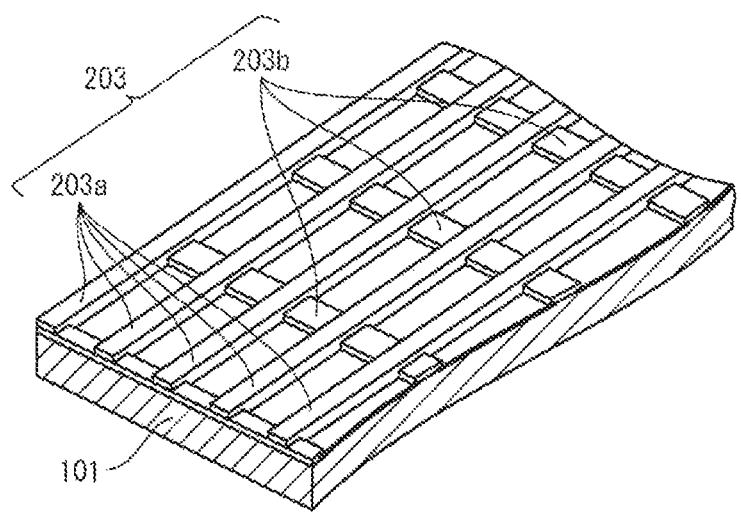

[FIG. 14]
(a)
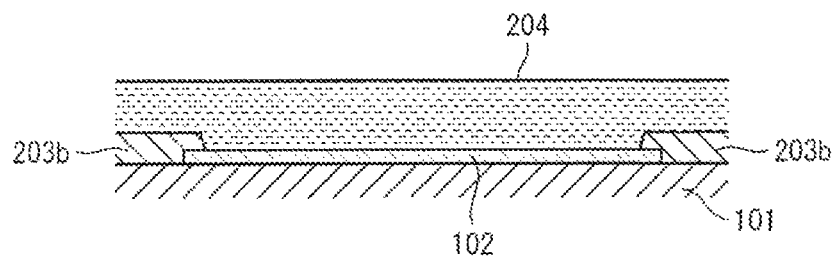
(b)
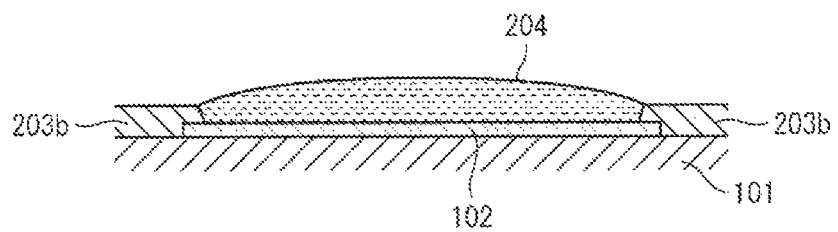
(c)
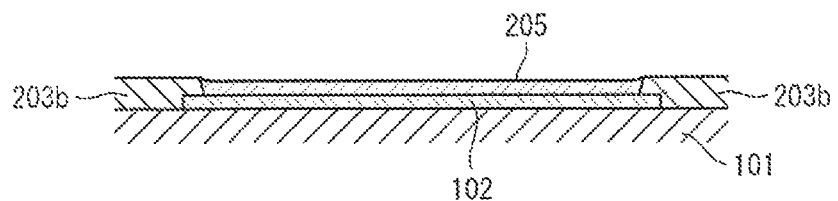

[FIG. 15]
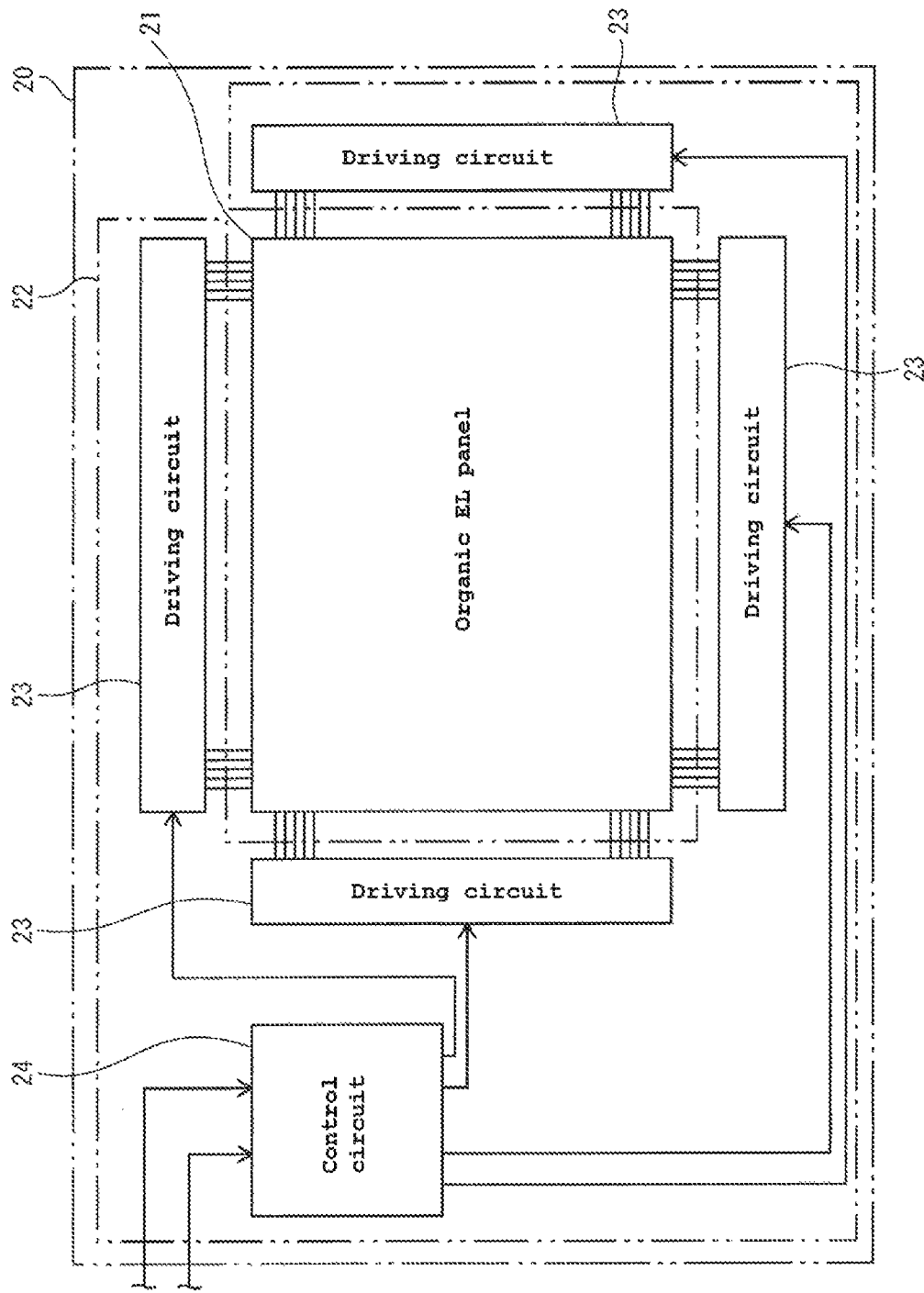

[FIG. 16]
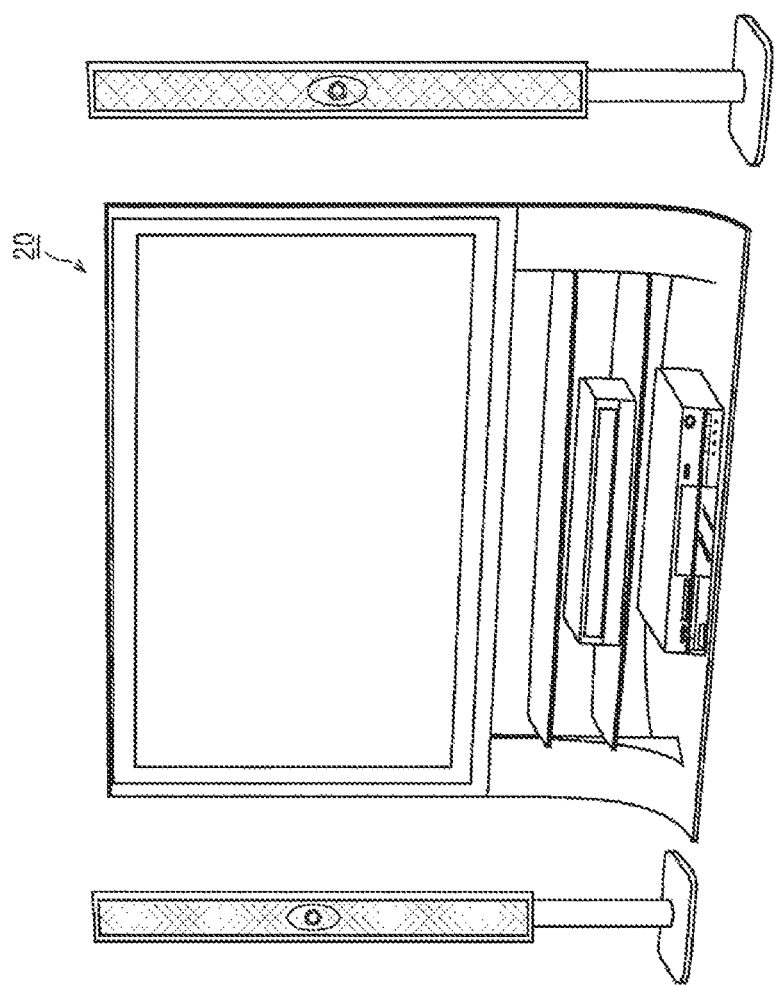

US 9,865,816 B2

SOLUTION FOR FORMING FUNCTION LAYER CONTAINED IN ORGANIC LIGHT EMITTING ELEMENT AND METHOD FOR MANUFACTURING ORGANIC LIGHT EMITTING ELEMENT

CROSS REFERENCE TO RELATED APPLICATIONS

This application is a U.S. National Phase of International Patent Application No. PCT/JP2015/001002 filed on Feb. 26, 2015, which claims priority benefit of Japanese Patent Application No. JP 2014-053357 filed in the Japan Patent Office on Mar. 17, 2014. Each of the above-referenced applications is hereby incorporated herein by reference in its entirety.

TECHNICAL FIELD

The present invention relates to physical properties of a solution for forming a function layer included in an organic light emitting element.

BACKGROUND ART

In recent years, research and development of organic light emitting elements have been progressing. An organic light emitting element is a light emitting element utilizing an electroluminescence phenomenon of an organic material, and has a pair of electrodes consisting of an anode and a cathode, and a light emitting layer sandwiched between the electrodes. In addition, for example, a hole injection layer and a hole transport layer or a combined hole injection and transport layer are interposed, as required, between the anode and the light emitting layer, whereas an electron injection layer and an electron transport layer or a combined electron injection and transport layer are interposed, as required, between the cathode and the light emitting layer. Since the light emitting layer, the hole injection layer, the hole transport layer, the combined hole injection and transport layer, the electron injection layer, the electron transport layer, and the combined electron injection and transport layer each fulfill an intrinsic function such as light emission, electric charge injection or transport, these layers are generically referred to as "function layer."

In an organic display of a full-color display type, such organic light emitting elements correspond to sub-pixels for each of RGB (Red-Green-Blue) colors, wherein adjacent RGB sub-pixels together form a single pixel, and the pixels are arranged in a matrix form to form an image display region.

In such an organic display, in order to obtain high-definition images, it is demanded that the pixels be formed with one side of each pixel being in a minute size of not more than approximately 500 µm. In a system where the pixel size is thus minute, the film thickness of the function layer in each element should be set as small as several tens to several hundreds of nanometers.

In manufacturing an organic display, there is a step of forming a function layer over an electrode. In this step, there has been proposed a wet system in which a solution containing a functional material and a solvent is applied to an upper side of the electrode, and the applied solution is dried to form the function layer.

CITATION LIST

Patent Literatures

[PTL 1]
  Japanese Patent Laid-open No. 2011-23668
[PTL 2]
  Japanese Patent Laid-open No. 1993-163488

SUMMARY

Technical Problem

Meanwhile, since light emission characteristics of an organic light emitting element are sensitive to the film thickness of the function layer, it is demanded to make the function layer flat when forming the function layer by the wet system. When a function layer is formed by the wet system, however, the function layer may have a larger film thickness at end portions thereof than at a central portion thereof, or may have a smaller film thickness at end portions thereof than at a central portion thereof, so that it may be difficult to secure flatness of the function layer.

In consideration of the above-mentioned problem, it is an object of the present invention to provide a solution and a method of manufacturing an organic light emitting element, by which a film thickness difference between end portions and a central portion of a function layer can be reduced.

Solution to Problem

A solution according to one mode of the present invention is a solution for forming a function layer included in an organic light emitting element. The solution contains a functional material for constituting the function layer, and a solvent. The solvent contains a high-boiling-point solvent composed of one or more solvent components having a boiling point of not less than 200° C. The high-boiling-point solvent has a viscosity of from 13 mPa·s to 25 mPa·s, inclusive, and a surface tension of from 33 mN/m to 37 mN/m, inclusive.

Advantageous Effect of Invention

With the viscosity and surface tension of the high-boiling-point solvent in the solution controlled to within the above-mentioned ranges, the film thickness difference between end portions and a central portion of the function layer can be reduced.

BRIEF DESCRIPTION OF DRAWINGS

FIGS. 1(a) to 1(c) are schematic views illustrating a drying process of a solution in the case of forming a function layer by a wet system.
FIG. 2 is a diagram showing boiling point, vapor pressure, viscosity and surface tension of each of solvent components.
FIG. 3(a) is a plan view of a substrate used in an experiment, and FIG. 3(b) is an A-A sectional view thereof.
FIG. 4(a) is a schematic view showing a case where the function layer is flat in shape, FIG. 4(b) is a schematic view showing a case where the function layer is convex in shape, and FIG. 4(c) is a schematic view showing a case where the function layer is concave in shape.
FIG. 5 is a diagram showing examples of the photograph of the function layer formed by use of each solvent and the evaluation results of the shape of the function layer.

FIG. 6 is a diagram showing evaluation results of the shape of the function layer, viscosity of a high-boiling-point solvent in a solution, and surface tension of the high-boiling-point solvent in the solution.

FIG. 7 is a graph obtained by plotting the viscosity of a high-boiling-point solvent of each solvent and the surface tension of the high-boiling-point solvent.

FIG. 8 shows views showing the planar shapes and sectional shapes of function layers on a solvent basis.

FIG. 9 is a graph obtained by plotting the proportion of a high-viscosity solvent in a high-boiling-point solvent of each solvent and the proportion of a flat region of a flat region in a light emitting region.

FIG. 10 is a graph showing the dependency of viscosity of a solution on the concentration of a functional material in the solution.

FIGS. 11(a) to 11(g) are sectional views for illustrating a method of manufacturing an organic light emitting element.

FIG. 12 is a perspective view showing one example of the shape of a partition wall layer.

FIG. 13 is a perspective view showing another example of the shape of the partition wall layer.

FIGS. 14(a) to 14(c) are schematic views illustrating a drying process of a solution in a case where the partition wall layer of FIG. 13 is utilized.

FIG. 15 is a functional block diagram of an organic display.

FIG. 16 is a perspective view showing by way of example an external appearance of the organic display.

DESCRIPTION OF EMBODIMENTS

<1> History of Reaching One Mode of Present Invention

FIG. 1 shows a drying process of a solution in a case of forming a function layer by a wet system. The solution 13 contains a functional material for forming the function layer, and a solvent in which to dissolve or disperse the functional material. The solution 13 is applied to a region partitioned by partition walls 12 on a substrate 11 (FIG. 1(a)).

The solution 13 thus applied assumes a shape wherein a central portion is swollen due to the surface tension of the solution 13. The solvent in the solution 13 gradually evaporates from the surface of the solution 13. In this case, as shown in FIG. 1(a), the evaporation rate of the solvent at end portions of the solution 13 is higher than the evaporation rate of the solvent at a central portion. This is because on the upper side of the central portion the evaporated solvent does not diffuse away easily and the vapor pressure of the solvent is liable to be kept high, whereas on the upper side of the end portions the evaporated solvent diffuses easily to the surroundings and the vapor pressure of the solvent is liable to be lowered. Due to the difference in evaporation rate, flows 14 of the solution in directions from the central portion toward the end portions are generated in a surface layer portion of the solution 13, and, attendant on this, flows 15 of the solution in directions from the end portions toward the central portion are generated in a deep layer portion of the solution 13. As the drying of the solution 13 proceeds, the amount of the solution 13 gradually decreases (FIG. 1(b)), and the concentration of the functional material rises accordingly. Finally, the solvent in the solution 13 evaporates completely, whereby a function layer 16 composed of the functional material is formed (FIG. 1(c)).

The shape of the function layer 16 is considered to depend more heavily on the shape of the solution and behaviors of the functional material in the solution at the ending stage (FIG. 1(b)) of the drying process of the solution 13 than on those at the beginning stage (FIG. 1(a)) of the drying process. The present inventors thought that in order to reduce the film thickness difference between end portions and a central portion of the function layer 16, it is sufficient to appropriately control parameters that determine the shape of the solution 13 and the behaviors of the functional material at the ending stage of the drying process of the solution 13. Furthermore, the present inventors paid attention to the viscosity and surface tension of a high-boiling-point solvent having a boiling point of not less than 200° C., as the parameters. First, attention was paid to the high-boiling-point solvent because physical properties of the solution 13 at the ending stage of the drying process of the solution are considered to greatly depend on physical properties of the high-boiling-point solvent. For example, in the case where the solution 13 contains a high-boiling-point solvent and a low-boiling-point solvent, the low-boiling-point solvent evaporates earlier than the high-boiling-point solvent in the drying process of the solution 13, so that the high-boiling-point solvent exists more abundantly at the ending stage of the drying process of the solution 13. In addition, in the case where the solution 13 contains a high-boiling-point solvent but does not contain any low-boiling-point solvent, only the high-boiling-point solvent exists at the beginning stage and at the ending stage of the drying process of the solution 13. Therefore, it can be said that in the case where the solution 13 contains a high-boiling-point solvent, the physical properties of the solution 13 at the ending stage of the drying process of the solution 13 are heavily dependent on the physical properties of the high-boiling-point solvent. Besides, attention was paid especially to the viscosity and surface tension among the physical properties of the high-boiling-point solvent, since it is considered that the viscosity influences the behaviors of the functional material in the solution and that the surface tension affects the shape of the solution.

The present inventors obtained a plurality of solvents by selecting one or more solvent components and mixing the selected solvent components in one or more volume ratios. Then, using each of the solvents obtained, function layers 16 were formed, and the shape of each of the function layers 16 was observed. As a result, it was found that when the viscosity and surface tension of the high-boiling-point solvent contained in the solution are within specified ranges, the film thickness difference between end portions and a central portion of the function layer 16 can be reduced.

<2> Outline of One Mode of Present Invention

A solution according to one mode of the present invention contains a functional material for constituting a function layer included in an organic light emitting element, and a solvent. The solvent contains a high-boiling-point solvent composed of one or more solvent components having a boiling point of not less than 200° C. The high-boiling-point solvent has a viscosity of from 13 mPa·s to 25 mPa·s, inclusive, and a surface tension of from 33 mN/m to 37 mN/m, inclusive.

With the viscosity and surface tension of the high-boiling-point solvent in the solution controlled to within the above-mentioned ranges, the film thickness difference between end portions and a central portion of the function layer can be reduced.

Note that in the case where the high-boiling-point solvent is composed of a plurality of solvent components, the viscosity of the high-boiling-point solvent can be obtained by a method wherein the product of volume ratio of a solvent component and the viscosity of the solvent component at room temperature is calculated on a solvent component basis, and the thus calculated products for the solvent components are added up. Similarly, the surface tension of the high-boiling-point solvent can be obtained by a method in which the product of volume ratio of a solvent component and the surface tension of the solvent component at room temperature is calculated on a solvent component basis, and the thus calculated products for the solvent components are added up.

Besides, the viscosity of the high-boiling-point solvent may be greater than 15 mPa·s.

In addition, at least one of the one or more solvent components constituting the high-boiling-point solvent may be a high-viscosity solvent having a viscosity of not less than 20 mPa·s, and the proportion of the high-viscosity solvent in the high-boiling-point solvent may be not less than 35 vol %. By this, the proportion of a flat region in the function layer can be enhanced.

Besides, the proportion of the high-viscosity solvent in the high-boiling-point solvent may be not less than 50 vol %. By this, the proportion of the flat region in the function layer can be further enhanced.

In addition, the solvent may further contain a low-boiling-point solvent composed of one or more solvent components having a boiling point of below 200° C., and the viscosity of the solution may be from 5 mPa·s to 15 mPa·s, inclusive. In the case of applying a solution, there exists a suitable range for the viscosity of the solution, from the viewpoint of ease of application. However, since the viscosity of the high-boiling-point solvent is determined from the viewpoint of flatness of the shape of the function layer as aforementioned, the viscosity of the solution may fall out of the suitable range for application. Therefore, the viscosity of the solution may be controlled to within a suitable range, by containing a low-boiling-point solvent in the solution. With the viscosity of the solution controlled to be from 5 mPa·s to 15 mPa·s, inclusive, it is possible to suitably utilize the solution for an applying method based on an ink jet system, for example.

In addition, the one or more solvent components constituting the low-boiling-point solvent may all have a boiling point of above 160° C. By this, it is possible to obviate a situation in which the low-boiling-point solvent partly evaporates before application of the solution, leading to changes in the concentration or solvent composition ratios of the solution.

Besides, the solvent may further contain a low-boiling-point solvent composed of one or more solvent components having a boiling point of below 200° C., and the proportion of the high-boiling-point solvent in the solvent may be not more than 80%. By this, it is possible to inhibit the generation of a coffee stain phenomenon and to obtain a favorable film shape.

Furthermore, the proportion of the high-boiling-point solvent in the solvent may be not more than 60%.

A method of manufacturing an organic light emitting element according to one mode of the present invention includes forming a first electrode, applying a solution containing a functional material and a solvent to an upper side of the first electrode, drying the thus applied solution to form a function layer composed of the functional material over the first electrode, and forming a second electrode over the function layer. Here, the solvent contains a high-boiling-point solvent composed of one or more solvent components having a boiling point of not less than 200° C. The high-boiling-point solvent has a viscosity of from 13 mPa·s to 25 mPa·s, inclusive, and a surface tension of from 33 mN/m to 37 mN/m, inclusive.

By this, the film thickness difference between end portions and a central portion of the function layer can be reduced, and, as a result, favorable light emission characteristics of an organic light emitting element can be obtained.

<3> First Embodiment (Solution)

<3.1> Functional Material

The solution contains a functional material. The functional material is a material for constituting the function layer included in the organic light emitting element. As aforementioned, examples of the function layer include a light emitting layer, a hole injection layer, a hole transport layer, a combined hole injection and transport layer, an electron injection layer, an electron transport layer, and a combined electron injection and transport layer.

Examples of the material which can be utilized for the hole injection layer, the hole transport layer and the combined hole injection and transport layer include triazole derivatives, oxadiazole derivatives, imidazole derivatives, polyarylalkane derivatives, pyrazoline derivatives and pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, poryphyrin derivatives, aromatic tertiary amine compounds and styrylamine compounds, butadiene compounds, polystyrene derivatives, hydrazone derivatives, triphenylmethane derivatives, and tetraphenylbenzyne derivatives, which are described in PTL 2.

Examples of the material which can be utilized for the light emitting layer include fluorescent materials such as oxynoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, Rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, anthracene compounds, cyanine compounds, acridine compounds, metal complexes of 8-hydroxyquinoline compounds, metal complexes of 2-bipyridine compounds, complexes of a Schiff salt and a Group III metal, oxine metal complexes, and rare earth complexes, which are described in PTL 2.

Examples of the material which can be utilized for the electron injection layer, the electron transport layer and the combined electron injection and transport layer include nitro-substituted fluorenone derivatives, thiopyran dioxide derivatives, diphequinone derivatives, perylenetetracarboxyl derivatives, anthraquinodimethane derivatives, fleorenylidenemethane derivatives, anthrone derivatives, oxadiazole derivatives, perinone derivatives, and quinoline complex derivatives, which are described in PTL 2.

<3.2> Solvent

The solution contains a solvent in addition to the functional material. The solvent contains a high-boiling-point solvent and, if necessary, also contains a low-boiling-point solvent. Herein, for convenience, the boundary between a high boiling point and a low boiling point is set at 200° C. The high-boiling-point solvent is composed of one or more solvent components having a boiling point of not less than 200° C. Besides, the low-boiling-point solvent is composed of one or more solvent components having a boiling point of below 200° C.

Further, if necessary, at least one of the one or more solvent components constituting the high-boiling-point solvent is a high-viscosity solvent. Herein, for convenience, the boundary between high viscosity and low viscosity is set at 20 mPa·s.

Examples of the material which can be utilized as the solvent component include methanol, ethanol, propanol, isopropyl alcohol, butanol, isobutyl alcohol, sec-butyl alcohol, tert-butyl alcohol, ethylene glycol, 1,2-dimethoxyethane, diethyl ether, diisopropyl ether, acetic acid, ethyl acetate, acetic anhydride, tetrahydrofuran, 1,4-dioxane, acetone, ethyl methyl ketone, carbon tetrachloride, chloroform, dichloromethane, 1,2-dichloroethane, benzene, toluene, xylene, cyclohexane, pentane, hexane, heptane, acetonitrile, nitromethane, N,N-dimethylformamide, hexamethylphosphoric triamide, triethylamine, pyridine, dimethyl sulfoxide, carbon disulfide, 1,3-dimethyl-2-imidazolidinone, dipropylene glycol, diethylene glycol monobutyl ether, ethylene glycol monoethyl ether acetate, propylene glycol, 2,3-butanediol, cyclohexanol, cyclohexylbenzene, ethylene glycol monophenyl ether, and ethylene glycol monobutyl ether.

<3.3> Experiment and Discussion

First, an experiment carried out to determine physical properties of solvents for reducing the film thickness difference between end portions and a central portion of the function layer will be described.

The present inventors prepared the solvents set forth in FIG. 2, as the solvent components. FIG. 2 shows boiling point, vapor pressure, viscosity and surface tension of each of the solvent components. The present inventors obtained solvents A, B, C, D, E, F, G and H by selecting one or more solvent components from among these solvent components and mixing the selected solvent components in an appropriate volume ratio or ratios.

Using the solvents A, B, C, D, E, F, G and H obtained above, the present inventors formed function layers on substrates. The functional material for forming the function layer was common to the solvents. A plan view of the substrate used in the experiment is shown in FIG. 3($a$), and its A-A sectional view is shown in FIG. 3($b$). The partition walls 12 surround that region of the substrate 11 made of glass in which to form the function layer. The region partitioned by the partition walls 12 has a width in a longitudinal direction of approximately 254 μm and a width in a short direction of approximately 60 μm. In this experiment, a target film thickness of the function layer 16 is 30 nm.

The present inventors, further, classified the shapes of the function layers formed into "flat," "convex" and "concave." Using FIG. 4, the technique of classifying the shapes of the function layers will be described. FIG. 4($a$) shows a flat shape, FIG. 4($b$) shows a convex shape, and FIG. 4($c$) shows a concave shape.

As shown in FIG. 4($a$), inner peripheral surfaces of the partition walls 12 are inclined surfaces, and, therefore, both side portions in the longitudinal direction of the function layer 16 come to be situated on the partition walls 12. Here, the position at which the height of the upper surface of the function layer 16 from the substrate 11 is 200 nm is defined as a reference position. In the section shown in FIG. 4($a$), there are two reference positions. The region located between these reference positions is defined as a light emission region of the function layer 16. In addition, the position of the center of the light emission region of the function layer 16 is defined as a central portion C of the function layer 16. Besides, the positions deviated from the reference positions toward the central portion C by 12.5% of the width of the light emission region of the function layer 16 are each defined as an end portion L and an end portion R of the function layer 16. Further, the film thickness of the function layer 16 at the central portion C is made to be dC, the film thickness at the end portion L is made to be dL, the film thickness at the end portion R is made to be dR, the film thickness difference Δd between the end portions and the central portion of the function layer 16 is calculated by use of the following formula, and the shapes of the function layers 16 are classified by use of the film thickness difference Δd.

$$\Delta d=(dL+dR)/2-dC$$

The "flat" shape corresponds to the case where the absolute value of the film thickness difference Δd is not more than 20% of the film thickness dC at the central portion C.

The "convex" shape corresponds to the case where the absolute value of the film thickness difference Δd is greater than 20% of the film thickness dC at the central portion C and the film thickness difference Δd is negative.

The "concave" shape corresponds to the case where the absolute value of the film thickness difference Δd is greater than 20% of the film thickness dC at the central portion C and the film thickness difference Δd is positive.

FIG. 5 shows examples of the photograph of the function layer formed by use of each solvent and the evaluation results of the shapes of the function layers. From this figure, it is seen that even if the functional material is commonly used, the shape of the function layer is different when the solvent used is different.

FIG. 6 shows the evaluation results of the shape of the function layer, the viscosity of the high-boiling-point solvent in the solution, and the surface tension of the high-boiling-point solvent in the solution. FIG. 7 shows a graph obtained by plotting the viscosity of the high-boiling-point solvent of each solvent and the surface tension of the high-boiling-point solvent.

In FIG. 7, attention is paid to the group including the solvents A and B and the group including the solvents C and E, then there can be read a tendency that where the viscosity of the high-boiling-point solvent is roughly the same, a convex shape is obtained when the surface tension of the high-boiling-point solvent is higher whereas a concave shape is obtained when the surface tension of the high-boiling-point solvent is lower. In addition, in FIG. 7, attention is paid to the group including the solvents C and E and the group including the solvents D, F and G, then there can be read a tendency that where the surface tension of the high-boiling-point solvent is roughly the same, a flatter shape is obtained as the viscosity of the high-boiling-point solvent is higher. From these facts, it can be said that in order to make the function layer flat in shape, it is important to control the viscosity and surface tension of the high-boiling-point solvent in the solution to within appropriate ranges.

Through this experiment, it was made clear that the use of the group including the solvents D, F and G leads to a flat shape of the function layer. From this fact, it is seen that in order to make the function layer flat in shape, it is sufficient to control the viscosity of the high-boiling-point solvent in the solution to within the range of from 13 mPa·s to 25 mPa·s, inclusive, and control the surface tension of the high-boiling-point solvent in the solution to within the range of from 33 mN/m to 37 mN/m, inclusive. In addition, since there is a tendency that a flatter shape is obtained as the viscosity of the high-boiling-point solvent is higher, it is more preferable to set the viscosity of the high-boiling-point solvent in the solution to be greater than 15 mPa·s. Besides, the lower limit for the range of surface tension of the high-boiling-point solvent in the solution may be 34 mN/m in place of 33 mN/m. The upper limit for the range of surface tension of the high-boiling-point solvent in the solution may be 36 mN/m in place of 37 mN/m. Note that with the viscosity of the high-boiling-point solvent in the solution set to be not more than 25 mPa·s, the solution can be suitably utilized for an applying method based on an ink jet system.

The present inventors, further, formed function layers on a flat substrate having a liquid-repellent property, and observed the shapes of the function layers thus formed. In this experiment, ten drops of the solution were dropped onto the substrate, the dropped solution was vacuum dried, and the shapes of the function layers thus formed were measured by a laser microscope (VK-9700, Keyence Corporation). FIG. 8 shows the planar shapes and sectional shapes of the function layers on a solvent basis. The scale of images of the planar shapes is common to the solvents. Also, the scale of images of the sectional shapes is common to the solvents. From the figure, it is seen that the group including the solvents D, F and G (the shape of the function layer is flat in FIG. 7) and the group including the solvents A, B, C and E (the shape of the function layer is convex or concave in FIG. 7) differ from each other in the shape of the function layer. In the group including the solvents D, F and G, a so-called coffee stain phenomenon occurred, whereas in the group including the solvents A, B, C and E, the coffee stain phenomenon did not occur. The cause of this difference is considered to reside in the proportion of the high-boiling-point solvent in the solvent. The proportion of the high-boiling-point solvent is 33% for the solvent A, 33% for the solvent B, 60% for the solvent C, 100% for the solvent D, 53% for the solvent E, 83% for the solvent F, and 83% for the solvent G. It is considered that where the proportion of the high-boiling-point solvent is high, convection is liable to occur in the drying process of the solution, resulting in the generation of the coffee stain phenomenon. It is generally considered that a better film shape can be obtained in the case where the coffee stain phenomenon does not occur as compared to the case where the coffee stain phenomenon occurs. Therefore, it is preferable to control the viscosity and surface tension of the high-boiling-point solvent to levels comparable to that of the group including the solvents D, F and G (from 13 mPa·s to 25 mPa·s, inclusive, and from 33 mN/m to 37 mN/m, inclusive) and, simultaneously, lower the proportion of the high-boiling-point solvent as compared with that of the group including the solvents D, F and G (not more than 80%). Further, the proportion of the high-boiling-point solvent may be lowered to a level comparable to those of the solvents A, B, C and E (not more than 60%). By this, a better film shape can be obtained. Note that the proportion of the high-boiling-point solvent can be easily lowered by addition of a low-boiling-point solvent.

Next, an experiment carried out to determine physical properties of solvents for enhancing the proportion of the flat region in the light emission region of the function layer will be described.

The present inventors prepared a plurality of solvents, formed function layers by use of the solvents, and examined the proportion of the flat region in the light emission region of the function layer for each of the function layers thus formed. Here, the flat region is defined to be the length of that region in which the film thickness of the function layer falls within the range of ±20% of the target film thickness (in this example, 30 nm) in the section of FIG. 3(a).

FIG. 9 shows a graph obtained by plotting the proportion of the high-viscosity solvent in the high-boiling-point solvent for each solvent and the proportion of the flat region of the flat region in the light emission region. In the group of solvents where the proportion of the high-viscosity solvent is 0 vol %, the proportion of the flat region in the light emission region is distributed in the range of 40% to 60%. In the group of solvents where the proportion of the high-viscosity solvent is approximately 35 vol %, the proportion of the flat region in the light emission region is distributed in the range of 60% to 70%. In the group of solvents where the proportion of the high-viscosity solvent is 50 vol %, the proportion of the flat region in the light emission region is distributed in the range of 75% to 85%. Thus, in the group of solvents where the proportion of the high-viscosity solvent is approximately 35 vol %, the proportion of the flat region in the light emission region is higher than that obtained in the group of solvents where the proportion of the high-viscosity solvent is 0 vol %. Besides, in the group of solvents where the proportion of the high-viscosity solvent is 50 vol %, the proportion of the flat region in the light emission region is further higher, generally approximately 75% to 85%. Therefore, the flatness of the function layer can be enhanced by controlling the proportion of the high-viscosity solvent in the high-boiling-point solvent to a value of not less than 35 vol %. Besides, it is more preferable to set the proportion of the high-viscosity solvent to a value of not less than 50 vol %.

Next, the molecular weight of the functional material will be discussed. FIG. 10 shows the dependency of the viscosity of a solution on the concentration of the functional material in the solution. Four kinds of solutions containing a common solvent and different functional materials were prepared, and, for each of the four kinds of solutions, variation in the viscosity of the solution with variation in the concentration of the functional material in the solution was measured. From the figure, it is seen that the viscosity of the solvent is higher as the concentration of the functional material is higher. More in detail, it is seen that in the case where the functional material is a low molecular material, the proportion of variation in the viscosity of the solution based on variation in the concentration of the functional material is lower than in the case where the functional material is a high molecular material.

In a process of applying a solution to a substrate and drying the applied solution to form the function layer, the concentration of the functional material increases as the solvent evaporates in the process of drying of the solution. FIG. 10 shows that the viscosity of a solution is increased also by a rise in the concentration of the functional material in the drying process of the solution. When the viscosity of a solution increases, the flow of the solution becomes weaker, producing a reduced influence on the behaviors of the functional material. Meanwhile, it is seen from FIG. 10 that in the case where the functional material is a low molecular material, the proportion of variation in the viscosity of the solution based on variation in the concentration of the functional material is smaller as compared to the case where the functional material is a high molecular material. Therefore, in the case where the functional material is a high molecular material, the flow of the solution is more easily weakened, producing a reduced influence on the behaviors of the functional material. On the other hand, in the case where the functional material is a low molecular material, the flow of the solution is less easily weakened, so that the flow produces a heavy influence on the behaviors of the functional material. In other words, the difficulty in making the function layer flat in shape is present both in the case where the functional material is a high molecular material and in the case where the functional material is a low molecular material, but the difficulty is particularly greater in the case of the low molecular material. Accordingly, the solvent wherein the viscosity and surface tension of a high-boiling-point solvent are set to within appropriate ranges is applicable both to the case where the functional material is a high molecular material and to the case where the functional material is a low molecular material, but the solvent is particularly useful for the case of the low molecular material. Note that a low molecular material herein refers to a material such that the Mark-Houwink-Sakurada equation is not established. The molecular weight of such a low molecular material is not more than several thousands.

<4> Second Embodiment (Method of Manufacturing Organic Light Emitting Element)

FIG. 11 shows sectional views for illustrating a method of manufacturing an organic light emitting element.

First, a substrate 101 is prepared, and a first electrode 102 is formed on the substrate 101 (FIG. 11(a)).

Next, a partition wall layer 103 is formed on the substrate 101 (FIG. 11(b)). The partition wall layer 103 is electrically insulating, and has an opening over the first electrode 102. Those parts of the partition wall layer 103 which surround the opening function as partition walls. FIG. 12 shows the shape of the partition wall layer 103.

Subsequently, a solution 104 is applied to a region which is partitioned by the partition wall layer 103 over the first electrode. The solution 104 contains a functional material and a solvent. In this example, the functional material is explained as a material for forming a combined hole injection and transport layer. The solvent contains a high-boiling-point solvent composed of one or more solvent components having a boiling point of not less than 200° C. The high-boiling-point solvent has a viscosity of from 13 mPa·s to 25 mPa·s, inclusive, and a surface tension of from 33 mN/m to 37 mN/m, inclusive.

Next, the applied solution 104 is dried, to form a combined hole injection and transport layer 105 over the first electrode 102 (FIG. 11(d)). The drying is conducted in atmospheric pressure or in vacuum, with or without heating.

Subsequently, a light emitting layer 106 is formed over the combined hole injection and transport layer 105 (FIG. 11(e)), a combined electron injection and transport layer 107 is formed over the light emitting layer 106 (FIG. 11(f)), and a second electrode 108 is formed over the combined electron injection and transport layer 107 (FIG. 11(g)).

By this, the film thickness difference between end portions and a central portion of the combined hole injection and transport layer 105 can be reduced, with the result that favorable light emission characteristics of the organic light emitting element can be obtained.

Note that the solvent may have not only the above-mentioned characteristic features but also the other characteristic features disclosed in the first embodiment. For instance, the viscosity of the high-boiling-point solvent may be greater than 15 mPa·s. In addition, the proportion of the high-viscosity solvent in the high-boiling-point solvent may be not less than 35 vol %, or not less than 50 vol %.

Note that the solvent may contain a low-boiling-point solvent composed of one or more solvent components having a boiling point of below 200° C., and the viscosity of the solution may be from 5 mPa·s to 15 mPa·s, inclusive. With the viscosity of the solution controlled to within this range, the solution can be suitably utilized for an applying method based on an ink jet system. In addition, the one or more solvent components constituting the low-boiling-point solvent may all have a boiling point of above 160° C. By this, it is possible to obviate a situation in which the low-boiling-point solvent partly evaporates before application of the solution, leading to changes in the concentration of the solution or the solvent composition ratios.

Note that while the combined hole injection and transport layer 105 is shown as an example of the function layer formed by application of the solution in the above example, this is not limitative. The light emitting layer 106 or the combined electron injection and transport layer 107 may be formed in place of the combined hole injection and transport layer 105, by application of a solution. Alternatively, a plurality of function layers of these function layers may be formed by application of solutions.

Besides, while a laminate structure of the first electrode, the combined hole injection and transport layer, the light emitting layer, the combined electron injection and transport layer, and the second electrode is adopted in the above example, this is not limitative.

In addition, while the partition wall layer 103 is in the shape as shown in FIG. 12 in the above example, this is not restrictive. For example, a partition wall layer 203 in the shape as shown in FIG. 13 may be utilized. The partition wall layer 203 includes a plurality of first banks 203a and a plurality of second banks 203b. The first banks 203a extend along the longitudinal direction of the light emission regions. The second banks 203b are each present between the adjacent first banks 203a, and extend along a short direction of the light emission regions. The height of the second banks 203b is smaller than the height of the first banks 203a.

FIG. 14 shows a drying process of the solution in the case where the partition wall layer of FIG. 13 is utilized.

In the case where the partition wall layer 203 is utilized, a solution 204 applied to a region partitioned by the partition wall layer 203 (hereinafter referred to as "partitioned region") comes over the second banks 203b to reach the adjacent partitioned regions (FIG. 14(a)). In the drying process of the solution 204, the solution 204 is contained into the partitioned region (FIG. 14(b)), and, through further drying, a function layer 205 is formed in the partitioned region over the first electrode 102. Even in the case where the partition wall layer 203 is utilized, the same situation as in the case where the partition wall layer 103 is utilized is obtained at an ending stage (FIG. 14(b)) of the drying process of the solution 204. Therefore, even in the case where the partition wall layer 203 is utilized, the same effect as that in the case where the partition wall layer 103 is utilized can be obtained.

<5> Third Embodiment (Organic Display)

The above-mentioned organic light emitting element can be utilized for an organic display. FIG. 15 shows functional blocks of an organic display. FIG. 16 shows an external appearance of the organic display by way of example. The organic display 20 includes an organic display panel 21, and a driving control section 22 electrically connected to the organic display panel 21. The organic display panel 21 has the organic light emitting elements shown in FIG. 11(g). The driving control section 22 includes a driving circuit 23 for applying voltages between the first electrodes 102 and the second electrodes 108, and a control circuit 24 for controlling the operation of the driving circuit 23.

INDUSTRIAL APPLICABILITY

One mode of the present invention is applicable, for example, to an organic light emitting element.

REFERENCE SIGNS LIST

11 Substrate
12 Partition wall
13 Solution
16 Function layer
20 Organic display
21 Organic display panel
22 Driving control section
23 Driving circuit
24 Control circuit
101 Substrate
102 First electrode
103 Partition wall
103 Partition wall layer
104 Solution
105 Combined hole injection and transport layer
106 Light emitting layer
107 Combined electron injection and transport layer
108 Second electrode
203 Partition wall layer
203a Bank
203b Bank
204 Solution
205 Function layer

What is claimed is:

1. A solution, comprising:
a functional material that constitutes a function layer of an organic light emitting element; and
a solvent that contains a high-boiling-point solvent, wherein the high-boiling-point solvent is composed of at least one first solvent component having a boiling point greater than or equal to 200° C., and wherein the high-boiling-point solvent has a viscosity in a range from 13 mPa·s to 25 mPa·s, and a surface tension in a range from 33 mN/m to 37 mN/m.

2. The solution according to claim 1, wherein the viscosity of the high-boiling-point solvent is greater than 15 mPa·s.

3. The solution according to claim 1, wherein the at least one first solvent component constituting the high-boiling-point solvent comprises a high-viscosity solvent having a viscosity greater than or equal to 20 mPa·s, and a proportion of the high-viscosity solvent in the high-boiling-point solvent is greater than or equal to 35 vol %.

4. The solution according to claim 3, wherein the proportion of the high-viscosity solvent in the high-boiling-point solvent is greater than or equal to 50 vol %.

5. The solution according to claim 1, wherein the solvent further contains a low-boiling-point solvent composed of at least one second solvent component having a boiling point lower than 200° C., and the viscosity of the solution is in a range from 5 mPa·s to 15 mPa·s.

6. The solution according to claim 5, wherein the at least one second solvent component constituting the low-boiling-point solvent has a boiling point greater than 160° C.

7. The solution according to claim 1, wherein the solvent further contains a low-boiling-point solvent composed of at least one second solvent component having a boiling point lower than 200° C., and a proportion of the high-boiling-point solvent in the solvent is lower than 80%.

8. The solution according to claim 7, wherein the proportion of the high-boiling-point solvent in the solvent is lower than 60%.

9. A method of manufacturing an organic light emitting element, the method comprising:
forming a first electrode;
applying a solution containing a functional material and a solvent to a side of the first electrode;
drying the applied solution to form a function layer composed of the functional material over the first electrode; and
forming a second electrode over the function layer,
wherein the solvent contains a high-boiling-point solvent composed of at least one first solvent component having a boiling point greater than or equal to 200° C., and the high-boiling-point solvent has a viscosity in a range from 13 mPa·s to 25 mPa·s, and a surface tension in a range from 33 mN/m to 37 mN/m.

10. The method according to claim 9, wherein the viscosity of the high-boiling-point solvent is greater than 15 mPa·s.

11. The method according to claim 9, wherein the at least one first solvent component constituting the high-boiling-point solvent comprises a high-viscosity solvent having a viscosity greater than or equal to 20 mPa·s, and a proportion of the high-viscosity solvent in the high-boiling-point solvent is greater than or equal to 35 vol %.

12. The method according to claim 11, wherein the proportion of the high-viscosity solvent in the high-boiling-point solvent is greater than or equal to 50 vol %.

13. The method according to claim 9, wherein the solvent further contains a low-boiling-point solvent composed of at least one second solvent component having a boiling point lower than 200° C., and the viscosity of the solution is in a range from 5 mPa·s to 15 mPa·s.

14. The method according to claim 13, wherein the at least one second solvent component constituting the low-boiling-point solvent has a boiling point greater than 160° C.

15. The method according to claim 9, wherein the solvent further contains a low-boiling-point solvent composed of at least one second solvent component having a boiling point lower than 200° C., and a proportion of the high-boiling-point solvent in the solvent is lower than 80%.

16. The method according to claim 15, wherein the proportion of the high-boiling-point solvent in the solvent is lower than 60%.

* * * * *